(12) United States Patent
Reohr et al.

(10) Patent No.: US 8,605,489 B2
(45) Date of Patent: Dec. 10, 2013

(54) ENHANCED DATA RETENTION MODE FOR DYNAMIC MEMORIES

(75) Inventors: William Robert Reohr, Ridgefield, CT (US); Robert Kevin Montoye, New York, NY (US); Michael A Sperling, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 13/307,884

(22) Filed: Nov. 30, 2011

(65) Prior Publication Data

US 2013/0135941 A1    May 30, 2013

(51) Int. Cl.
G11C 11/24    (2006.01)
G11C 7/00    (2006.01)
G11C 5/14    (2006.01)
G11C 8/00    (2006.01)

(52) U.S. Cl.
USPC ............ 365/149; 365/189.09; 365/189.11; 365/222; 365/226; 365/227; 365/228; 365/229; 365/230.06

(58) Field of Classification Search
USPC ............ 365/149, 189.09, 189.11, 222, 226, 365/227, 228, 229, 233.1, 236, 203, 230.06
See application file for complete search history.

(56) References Cited

U.S. PATENT DOCUMENTS

| 5,596,534 | A | | 1/1997 | Manning | |
|---|---|---|---|---|---|
| 5,654,913 | A | * | 8/1997 | Fukushima et al. | 365/222 |
| 5,712,825 | A | * | 1/1998 | Hadderman et al. | 365/222 |
| 6,021,063 | A | | 2/2000 | Tai | |
| 6,058,063 | A | | 5/2000 | Jang | |
| 6,249,473 | B1 | | 6/2001 | Lau et al. | |
| 6,327,682 | B1 | * | 12/2001 | Chien et al. | 365/189.11 |
| 6,377,494 | B1 | * | 4/2002 | Maruyama | 365/189.09 |
| 6,411,543 | B2 | * | 6/2002 | Narui et al. | 365/149 |
| 6,781,908 | B1 | | 8/2004 | Pelley et al. | |
| 6,888,769 | B2 | | 5/2005 | Kirsch | |
| 7,290,203 | B2 | | 10/2007 | Emma et al. | |
| 7,535,749 | B2 | | 5/2009 | Lines | |
| 8,223,577 | B2 | * | 7/2012 | Akiba et al. | 365/226 |
| 8,295,115 | B2 | * | 10/2012 | Kim et al. | 365/222 |
| 8,339,891 | B2 | * | 12/2012 | Arntzen et al. | 365/226 |
| 8,374,047 | B2 | * | 2/2013 | Oh | 365/222 |

OTHER PUBLICATIONS

Joohee Kim et al., "Dynamic Memory Design for Low Data-Retention Power," PATMOS 2000, LNCS 1918, pp. 207-216, 2000.

* cited by examiner

*Primary Examiner* — Trong Phan
(74) *Attorney, Agent, or Firm* — Louis J. Percello, Esq.; Otterstedt, Ellenbogen & Kammer, LLP

(57) ABSTRACT

A memory device includes memory cells, each of the memory cells having corresponding bit and word lines connected thereto for accessing the memory cells, a word line circuit coupled with at least one word line, and a bit line circuit coupled with at least one bit line. The memory device further includes at least one control circuit coupled with the bit and word line circuits. The control circuit is operative to cause state information to be stored in the memory cells. At least one switching element selectively connects the memory cells, the bit and word line circuits, and the control circuit to at least one power supply as a function of at least one control signal. The control circuit generates the control signal for disconnecting at least portions of the word line and bit line circuits from the power supply while state information is retained in the memory cells.

25 Claims, 10 Drawing Sheets

ENHANCED DATA RETENTION MODE FOR DYNAMIC MEMORIES

FIELD OF THE INVENTION

The present invention relates generally to the electrical, electronic, and computer arts, and more particularly relates to memory systems.

BACKGROUND

The emergence of data-intensive applications in mobile environments (e.g., smart phones, tablet personal computers, and the like) has resulted in portable electronic systems with increasingly large dynamic memories (e.g., dynamic random access memory (DRAM)). A typical operating pattern exhibited by these applications involves relatively short bursts of operations followed by comparatively longer standby periods. Due to refresh requirements and peripheral circuit leakage, DRAM consumes substantial power even during standby and thus has a significant impact on battery life of such portable electronic systems.

More particularly, due to charge leakage, data stored in a DRAM cell must be periodically refreshed. The elapsed time from when data is written to a DRAM cell to when the data is on the threshold of becoming corrupted due to charge leakage is referred to as the data retention time of the memory. The longer the data retention time, the less frequently the memory cell needs to be refreshed. Each refresh operation in a DRAM consumes power. Therefore, the longer the data retention time, the lower the required refresh power. It is important to keep in mind that, not only do the memory cells leak, but also the DRAM peripheral circuits leak continually. The power consumed through peripheral circuit leakage may dwarf that consumed by refresh, particularly in the case of embedded DRAM—a high performance DRAM technology.

Refresh (or data retention) and peripheral circuit leakage power is consumed even when the memory is not being accessed (i.e., when the memory is in a standby mode). Standby mode is often defined as a mode in which the memory is not being accessed (e.g., during a read or write operation), and some or all of the data stored in the memory is retained. In a power critical application, often the majority of the power is consumed in standby. In such an application, it is important to minimize both peripheral circuit leakage and refresh power to as low a level as possible.

SUMMARY

Advantageously, aspects of the present invention provide a mechanism for reducing overall power consumption in a dynamic memory (e.g., DRAM). To accomplish this, embodiments of the invention, during a deep sleep mode of operation in which no read, write or refresh operations are to be performed, beneficially cut off power to memory circuits driving the bit lines and other peripheral circuits while allowing the memory cells to preserve state temporarily without power. This state will be referred to herein as deep sleep. The memory is thus configured to interleave long periods of deep sleep with short bursts of refresh, in which power is restored only to perform a refresh operation.

In accordance with one embodiment of the invention, a memory device includes one or more memory cells, each of the memory cells having corresponding bit and word lines connected thereto for individually accessing the memory cells, a word line circuit coupled with at least one word line, and a bit line circuit coupled with at least one bit line. The memory device further includes at least one control circuit coupled with the bit and word line circuits. The control circuit is operative, via the bit and word line circuits, and the bit and word lines, to cause state information to be stored in the memory cells. At least one switching element selectively connects the memory cells, the bit and word line circuits, and the control circuit to at least one power supply as a function of at least one control signal. The control circuit generates the control signal for disconnecting at least portions of the word line and bit line circuits from the power supply while state information is retained in the memory cells.

In accordance with another embodiment of the invention, a method is provided for facilitating a data retention mode in a memory circuit including a plurality of dynamic memory cells and bit and word lines coupled to the memory cells, each of the memory cells having a unique pair of a corresponding bit line and a corresponding word line associated therewith for individually accessing the memory cells. The method includes the step of, upon receiving a request to enter the data retention mode, interleaving long periods of operation of the memory circuit in a first mode, wherein power to at least circuitry driving the bit lines is disconnected and the memory cells retain their respective state information stored therein, with short bursts of operation of the memory circuit in a second mode, wherein power is restored exclusively to circuitry used in performing a refresh of the memory cells and the memory cells are refreshed.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Embodiments of the present invention will be described herein in the context of illustrative methods and apparatus for extending a refresh cycle in a DRAM (e.g., stand-alone or embedded). It is to be appreciated, however, that the invention is not limited to the specific methods and apparatus illustratively shown and described herein. Rather, embodiments of the invention are directed broadly to techniques for reducing peripheral circuit leakage in a DRAM, thereby reducing the frequency of refresh operations and beneficially minimizing power consumption in the DRAM. In this manner, power consumption, particularly during a standby mode of operation (e.g., idle mode) of the DRAM, is significantly reduced. Moreover, it will become apparent to those skilled in the art given the teachings herein that numerous modifications can be made to the embodiments shown that are within the scope of the present invention. That is, no limitations with respect to the specific embodiments described herein are intended or should be inferred.

For the purpose of describing and claiming aspects of the invention, the term MISFET as used herein is intended to be construed broadly and to encompass any type of metal-insulator-semiconductor field effect transistor. The term MISFET is, for example, intended to encompass semiconductor field effect transistors that utilize an oxide material as their gate dielectric (i.e., MOSFETs), as well as those that do not. In addition, despite a reference to the term "metal" in the acronym MISFET, the term MISFET is also intended to encompass semiconductor field effect transistors wherein the gate is formed from a non-metal, such as, for instance, polysilicon.

Although implementations of the present invention described herein may be implemented using p-channel MISFETs (hereinafter called "PFETs") and n-channel MISFETs (hereinafter called "NFETs"), as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although embodiments of the invention are typically fabricated in a silicon wafer, embodiments of the invention can alternatively be fabricated in wafers comprising other materials, including but not limited to gallium arsenide (GaAs), indium phosphide (InP), etc.

Figure 1:
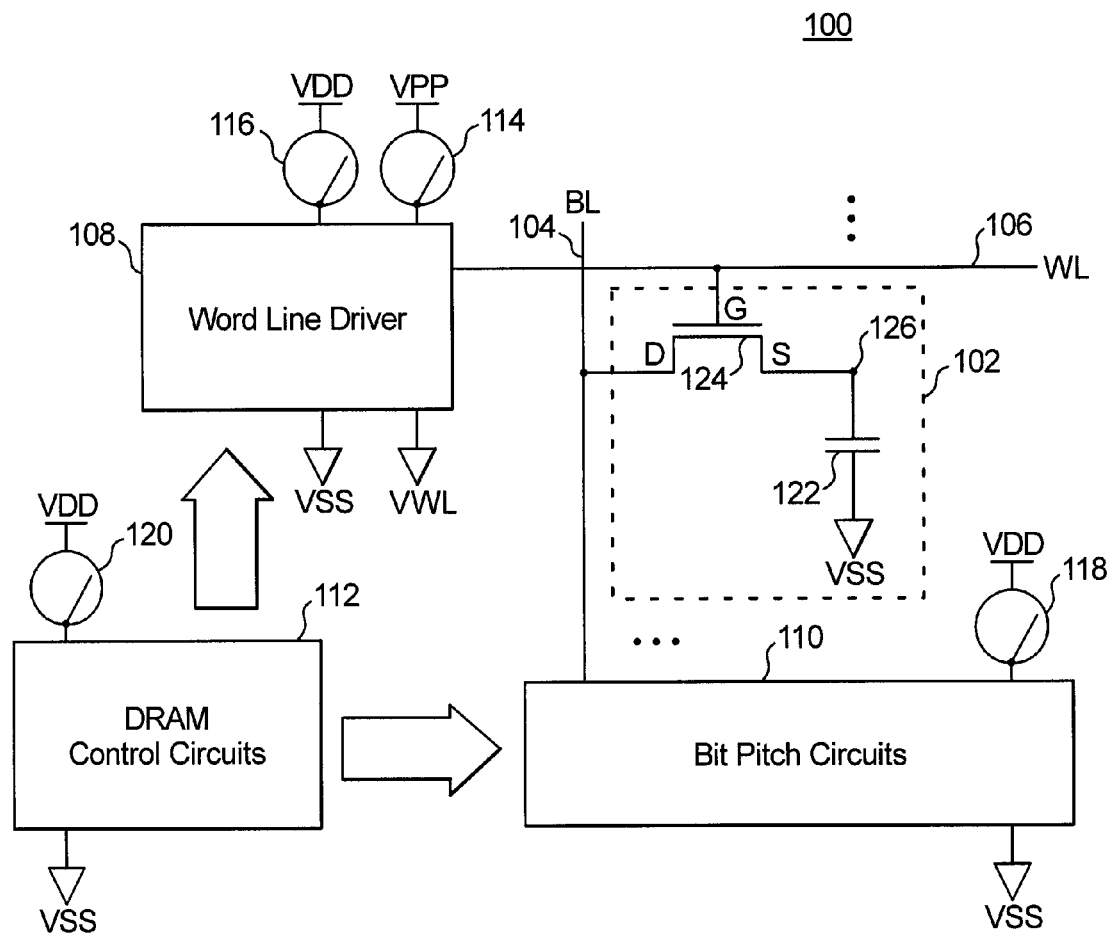
FIG. 1 is a block diagram illustrating at least a portion of an exemplary memory circuit in which techniques of the present invention may be implemented.

As a brief overview, FIG. 1 is a block diagram illustrating at least a portion of an exemplary memory circuit 100 in which techniques of the present invention may be implemented. Memory circuit 100 includes a plurality of dynamic memory cells, which may be implemented as DRAM cells 102 (only one of which is explicitly shown), each DRAM cell 102 being connected with a unique pair of a corresponding bit line (BL) 104 and word line (WL) 106 for selectively accessing the cell. In the embodiment shown, bit lines 104 are arranged substantially vertically in the memory circuit 100 and word lines are arranged substantially horizontally, although the invention is not limited to any specific orientation of the respective bit and word lines.

Bit pitch circuits 110 are defined broadly herein as comprising at least one sense amplifier for detecting the state of "selected" memory cells 102, at least one write circuit for writing state into "selected" memory cells 102, and at least one precharge circuit for defining the "initial" voltage of the bit lines 104. In other embodiments, may include additional circuitry, such as, but not limited to, read and write circuitry.

Traditionally, word lines 106 are used to select (i.e., activate) the memory cells 102 and bit lines 104 are used to access (i.e., read or write) the cells. Thus, a given memory cell is accessed by asserting a unique word line/bit line pair corresponding to the given cell. In order to selectively access a given subset of the memory cells 102, memory circuit 100 further includes a word line driver circuit 108, or alternative word line circuitry, connected with the plurality of word lines 106 and bit pitch circuits 110, or alternative bit line circuitry, connected with the plurality of bit lines 104. Word line driver circuit 108 is preferably operative to set the word lines 106 to a prescribed voltage level as a function of one or more control signals, as may be supplied, for example, by control circuitry 112 included in the memory circuit 100. The control circuitry 112 may also supply the bit pitch circuits 110 with one or more control signals for selectively reading or writing the memory cells 102.

Word line driver circuit 108 is preferably adapted for connection with a first supply voltage, which may be VPP, via a first switch 114, or alternative switching circuitry, and is adapted for connection with a second supply voltage, which may be VDD, via a second switch 116. Word line driver circuit 108 is also preferably connected with a third supply voltage, which may be VWL, and a fourth supply voltage, which may be VSS or ground. In one embodiment, VPP is substantially greater than VDD (e.g., VPP is about 2.0 volts and VDD is about 1.0 volt). In another embodiment, VWL is less than VSS (e.g., VSS is about zero volt and VWL is about −300 millivolts (mV)). Likewise, bit pitch circuits 110 and control circuitry 112 are preferably adapted for connection with VDD via a third switch 118 and a fourth switch 120, respectively. Thus, by opening one or more of the switches 114, 116, 118 and 120, one or more of the corresponding circuits connected therewith can be selectively disabled (i.e., cut off from their respective voltage supplies), such as, for example, during a deep sleep mode of operation. As will be explained in more detail below, deep sleep mode optimally consumes no power at all, as all the peripheral circuits are disconnected from their respective power supplies.

Although switches 114, 116, 118 and 120 are depicted in FIG. 1 as single-pole single-throw (SPST) switches, it is to be understood that such depiction is merely conceptual, and that the respective switching functions can be implemented using any suitable means known by those skilled in the art. For example, in a preferred embodiment, each of switches 114, 116, 118 and 120 is implemented using one or more transistor devices (not explicitly shown for clarity purposes). In a transistor implementation, each switch is configured to receive a control signal and to electrically connect two (or more) circuit nodes as a function of the control signal supplied thereto. Moreover, although shown as residing externally to the respective functional blocks to which switches 114, 116, 118 and 120 are connected, these functional blocks may, in some embodiments, incorporate one or more of the switches therein. For example, the functionality of switch 118 may be incorporated within the bit pitch circuits 110.

Each DRAM cell 102 preferably comprises a storage element 122, which in this embodiment comprises a storage capacitor, and an access device 124, which in this embodiment comprises an NFET device. More particularly, a first terminal of the storage capacitor 122 is adapted for connection with a first voltage source, which may be VSS or ground, a second terminal of the storage capacitor is coupled with a source (S) of NFET 124 at node 126, a drain (D) of NFET 124 is adapted for connection with a corresponding bit line 104, and a gate (G) of NFET 124 is adapted for connection with a corresponding word line 106. It is to be appreciated that, because a MISFET device is symmetrical in nature, and thus bidirectional, the assignment of source and drain designations in the MISFET device is essentially arbitrary. Therefore, the source and drain may be referred to herein generally as first and second source/drain, respectively, where "source/drain" in this context denotes a source or a drain.

Ideally, without taking into account the effects of leakage, when NFET 124 is turned off, such as when word line 106 is at a low logic level (e.g., zero volt), node 126 essentially floats and the charge stored on capacitor 122 will be stored indefinitely, even when power to the memory circuit 100 is removed. In practice, however, when considering leakage characteristics of the NFET 124, primarily, and, to lesser extent, storage capacitor 122, a high logic level stored in the capacitor 122 may eventually discharge to VSS, and a low logic level to VDD depending on the combination of bit line 104, word line 106, and on VSS voltages.

Given that DRAM cells store charge only and, unlike static random access memory (SRAM), don't require power for state storage, it is possible to temporarily cut off power to the cells and their surrounding circuits without loss of state. A DRAM macro, therefore, can preserve state temporarily essentially without power. A data retention mode for DRAM, as well as other dynamic memories, is preferably adapted to interleave long periods of deep sleep, ranging typically from 100 microseconds (μs) to 30 milliseconds (ms), wherein power to the circuits driving the bits lines (e.g., bit pitch circuits 110) is cut-off, and each memory cell preserves enough charge to define its state, with short bursts of refresh, wherein power is restored exclusively to circuits vital to that refresh operation so that each memory cell can be charged/restored in preparation for a subsequent period of deep sleep.

With the minor exception of a few circuits that would remain on, such as, for example, a voltage source operative to generate the word line voltage VWL, a memory circuit (e.g., DRAM macro) can preserve state almost without power. In such a data retention mode, the memory circuit, according to an embodiment of the invention, preferably alternates between a first mode, which may be a deep sleep mode wherein power to a majority of functional blocks therein is cut-off, and a second mode, which may be a refresh operation mode wherein sense amplifiers in the memory circuit are powered on. The deep sleep mode preferably has a first duration (e.g., about 100 μs to about 500 μs for embedded DRAM technology) which is substantially longer than a second duration of the refresh operation mode (e.g., about 2 μs; 2 nanosecond (ns) refresh of 1000 word lines in an illustrative 1 megabyte (Mb) embedded DRAM macro). An exemplary data retention methodology according to an embodiment of the invention is described in further detail in conjunction with FIG. 2.

Figure 2:
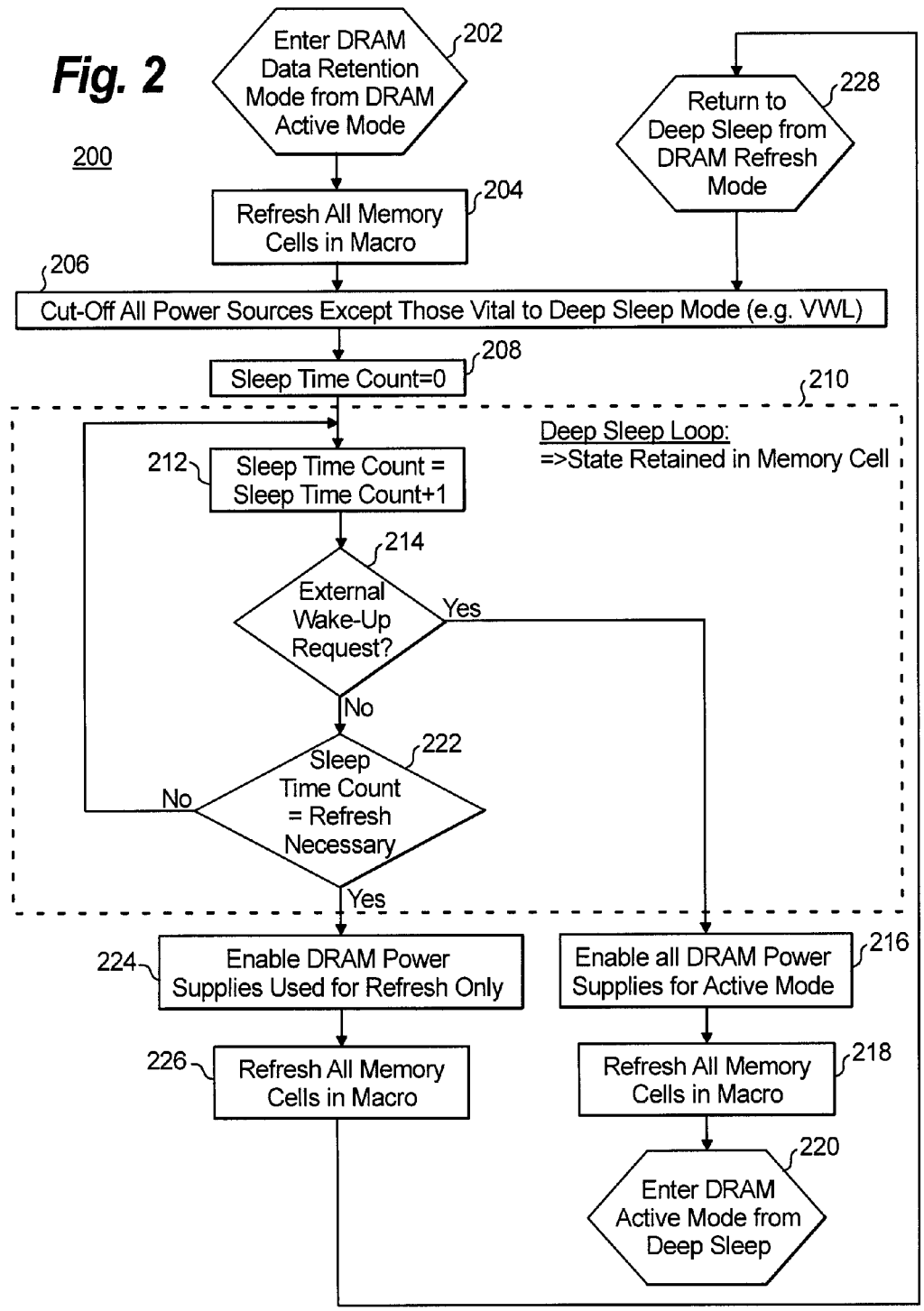
FIG. 2 is a flow diagram illustrating at least a portion of an exemplary methodology for performing periodic wake-up and refresh and for entering and exiting data retention mode in a memory circuit, according to an embodiment of the invention.

Specifically, FIG. 2 is a flow diagram illustrating at least a portion of an exemplary methodology 200 for performing periodic wake-up and refresh, from deep sleep, and for entering and exiting data retention mode in a memory circuit (e.g., memory circuit 100 shown in FIG. 1), according to an embodiment of the invention. With reference to FIG. 2, a first portion of method 200 begins by entering DRAM retention mode from an active mode in step 202. It is to be appreciated that the choice to enter or exit data retention mode is directed by system control logic (e.g., which may reside in the DRAM Control Circuits 112 in FIG. 1, or externally thereto). Upon entering data retention mode from step 202, all memory cells in the memory circuit (e.g., DRAM macro) are refreshed in step 204. Once all memory cells have been refreshed, all power sources except those vital to deep sleep mode (e.g., VWL) are cut-off from their respective memory circuits in step 206. A counter, which may be a sleep time counter, or alternative time tracking element, is then initialized in step 208. In this embodiment, a sleep time counter is preferably set equal to zero, although the invention is not limited to tracking elapsed time in this manner. Since the circuits in this embodiment only have a sense of cycles and not absolute time, it is effectively the cycles that are counted, although such cycles correspond to a finite amount of time; namely, the data retention time. At this point, method 200 enters a deep sleep loop 210, which will be described in further detail below.

During the deep sleep loop 210, state is retained in each of the memory cells. In one embodiment, word line driver 108 (see FIG. 1) is operative to drive each of the word lines 106 to a negative voltage level (e.g., −250 mV). This ensures that the access device (e.g., NFET 124 in FIG. 1) in each of the memory cells does not turn on or operate in subthreshold, thereby reducing leakage. In accordance with another embodiment, a word line driver is operative to drive each of the word lines 106 to ground.

In an alternative embodiment, a local bit line may remain in its precharge state at ground potential, and the nodes of other peripheral circuits discharge/leak to ground (after the peripheral circuits have been cut-off from their respective power supplies) and remain there. Such may be the practice for an embedded DRAM, exploiting what is known in the art as a grounded sensing scheme where the bit line is precharged to ground. While this preferred embodiment treats addresses a bit line precharged to ground, it is obvious/contemplated that for bit lines precharged to VDD that relative supply voltages powering word line drivers 108, DRAM Control Circuits 112, and Bit Pitch Circuits 110 can be reorganized to make VDD the new ground (in the preferred embodiment) where circuit nodes charge/decay/move to in deep sleep.

Furthermore, it is also contemplated that the local bit line may be driven to one-half the subarray voltage (i.e., VBLH/2), preferably defined as half-way between typical "0" and "1" logic level voltages of the memory cell as would typically be the case for stand-alone DRAM.

In the deep sleep loop 210, the sleep time counter is incremented, preferably by one, in step 212. It is to be appreciated that, in accordance with other embodiments, the sleep time counter may be initialized with a prescribed value in step 208 and then decremented (e.g., by one, or by another value) in step 212 for each pass of the deep sleep loop. After incrementing the sleep time counter, step 214 checks to determine if an external wake-up request has been received (i.e., the system wants to use the DRAM).

If an external wake-up request is received, process control exits the deep sleep loop 210 and continues at step 216, wherein all DRAM power supplies are enabled in preparation for an active mode of operation of the memory circuit. Next, all memory cells in the memory circuit are refreshed in step 218, after which method 200 enters an active mode of operation in step 220. The system then dictates when to return to the data retention mode (for power savings). In this instance, as before, the process starts with step 202.

If a wake-up request is not received, as determined in step 214, the deep sleep loop 210 resumes by checking the sleep time counter in step 222 to determine if the memory cells need to be refreshed. This may be accomplished, for example, by comparing the value of the sleep time counter with a prescribed number indicative of a maximum length of a refresh cycle of the memory circuit. If the maximum refresh period has not been reached, the method 200 proceeds back to step 212 where the sleep time counter is incremented (in step 212) and the next pass of the deep sleep loop 210 is processed.

If the maximum refresh period has been reached, as determined by checking the sleep time counter in step 222 against a prescribed threshold value, method 200 exits the deep sleep loop 210 and process control resumes at step 224 where DRAM power supplies used exclusively for performing a memory refresh operation are enabled (e.g., VPP, VBLH, and VDD associated with a row address counter in the word line driver circuit). Next, all memory cells in the memory circuit (e.g., DRAM macro) are refreshed in step 226 in a conventional manner. After performing the refresh operation, the memory circuit returns to the deep sleep mode from the DRAM refresh mode in step 228, whereby a second portion of the method 200 is initiated.

The second portion of method 200 begins by returning to the deep sleep mode from the DRAM refresh mode in step 228. To return to the deep sleep mode, all power sources except those vital to deep sleep mode (e.g., VWL) are preferably cut-off from their respective memory circuits in step 206. As apparent from FIG. 2, this second portion of method 200 is thus similar to the first portion, with the exception that the refresh operation performed in step 204 is omitted. The method 200 then continues as previously described by initializing the sleep time counter, or alternative time tracking element, by setting the sleep time counter to a prescribed value in step 208; zero in this embodiment, although the invention is not limited to any particular initialization value. The method 200 then enters the deep sleep loop 210.

As previously stated, in a data retention mode of the type described above in conjunction with FIG. 2, the illustrative memory circuit alternates between a deep sleep mode and a refresh operation mode. The duration of time spent in the deep sleep mode (e.g., about 100 μs to 500 μs for an exemplary embedded DRAM) is preferably considerably longer than the duration of time spent in the refresh operation mode (e.g., about 2 μs for an exemplary embedded DRAM). In essence, a linear regulator operating with the aforementioned time constants would preferably be required to cycle, in less than about 5 μs, between the deep sleep mode (i.e., power cut-off), wherein power to a majority of functional blocks is cut-off, and the refresh operation mode, wherein sense amplifiers—contained within bit pitch circuits 110—in the memory circuit are powered on.

Figure 3A:
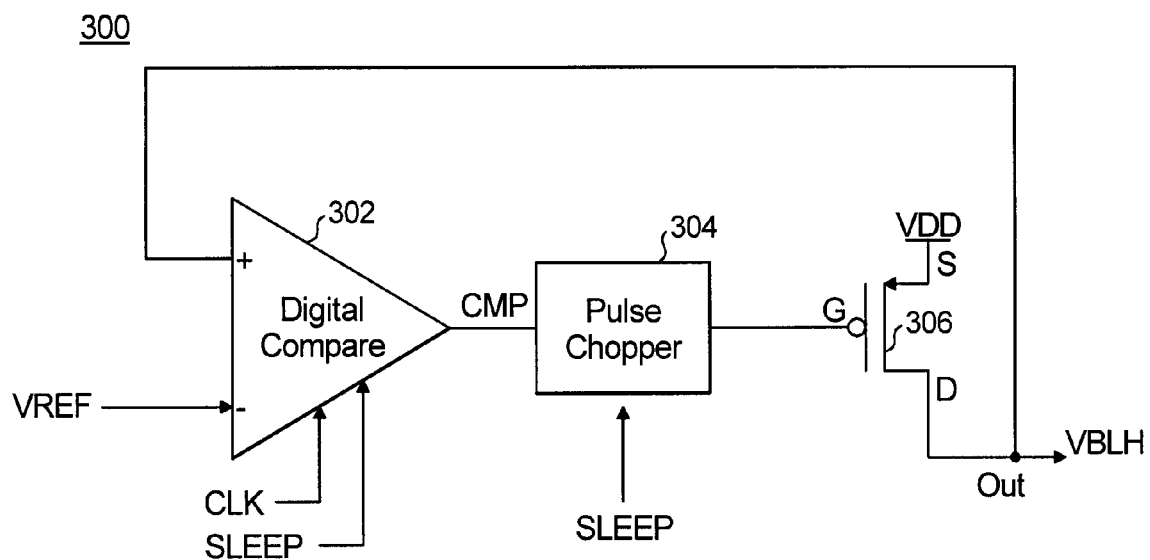
FIG. 3A is a schematic diagram depicting at least a portion of an exemplary linear voltage regulator operative to generate a bit line voltage suitable for use with the illustrative memory circuit shown in FIG. 1, according to an embodiment of the invention.

By way of example only and without loss of generality, FIG. 3A is a schematic diagram depicting at least a portion of an exemplary linear voltage regulator 300 operative to generate a regulated voltage, which may be a bit line voltage, VBHL, suitable for use with the illustrative memory circuit 100 shown in FIG. 1, according to an embodiment of the invention. The linear regulator 300 is preferably incorporated into the bit pitch circuits 110 (e.g., represented by switch 118) shown in FIG. 1. As is known by those skilled in the art, a linear regulator operates by using a voltage-controlled current source (typically implemented using an active transistor device operating in either its linear or saturation region) to force a substantially fixed voltage to appear at an output of the regulator. Control circuitry monitors (i.e., senses) the output voltage and adjusts the current source, as required by the output load, to hold the output voltage at a prescribed level. The design limit of the current source defines the maximum load current the regulator can source and still maintain regulation.

As shown in FIG. 3A, the exemplary linear regulator 300 includes a comparator 302, a pulse chopper 304, or alternative control circuit, and a PFET device 306, or an alternative voltage-controlled current source. PFET 306 includes a source adapted for connection with an input voltage, which in this embodiment is VDD, a drain adapted to generate a regulated output voltage, VBLH, at an output node OUT of the regulator, and a gate adapted to receive a control signal supplied thereto. Comparator 302 is operative to receive a reference signal, VREF, at a first input, which may be an inverting (−) input. VREF in an active mode can be any fixed or partially variable value, typically about 0.8V when VDD is 1.0V. During VBLH/2 mode the value of VREF is set to half the original value. This can be accomplished thru the use of a simple resistor divider, although the invention contemplates alternative voltage generation means. A second input, which may be a non-inverting (+) input of the comparator 302 is connected with the drain of PFET 306 at node OUT and monitors the output voltage VBLH of the regulator 300.

The comparator 302 is further operative to generate a signal, CMP, at an output thereof that is indicative of a difference between the reference signal VREF and the regulator output signal VBLH. Pulse chopper 304 is operative to receive the comparator output signal CMP and to generate the control signal as a function thereof supplied to the gate of PFET 306 for controlling the output voltage VBLH of the regulator 300. The comparator 302, pulse chopper 304 and PFET 306, collectively, form a closed-loop feedback control system.

The comparator 302 in this embodiment is preferably a digital comparator which is configured to receive a clock signal, CLK, and is operative to generate comparison output samples that are synchronized with the clock signal. The linear regulator 300 is also adapted to receive a control signal, SLEEP, which is indicative of a mode of operation in which the regulator is employed. For example, when the SLEEP signal is asserted (e.g., a logic high level), which may be indicative of operation in a deep sleep mode, the output voltage VBLH delivery to the memory circuit can be cut-off directly by disabling the PFET 306, such as by forcing the pulse chopper 304 to output a logic high signal supplied to the gate of the PFET 306, and the comparator 302 is preferably disabled, thereby shutting down power consumption in the regulator 300. With PFET 306 turned off, the output node OUT of the regulator 300 will essentially float, and therefore the output voltage VBLH will eventually leak down close to GND.

It is to be understood that, although the linear regulator 300 is depicted using a digital comparator 302, the invention is not limited to using any specific type of comparator. For example, in alternative embodiments, an analog comparator (not explicitly shown) may be used. Moreover, although in regulator 300 the PFET 306 is disabled by forcing the pulse chopper 304 to output a logic high signal during deep sleep mode, the PFET need not be turned off, in accordance with alternative embodiments of the invention, as will be described in further detail below in conjunction with FIG. 3B.

Figure 3B:
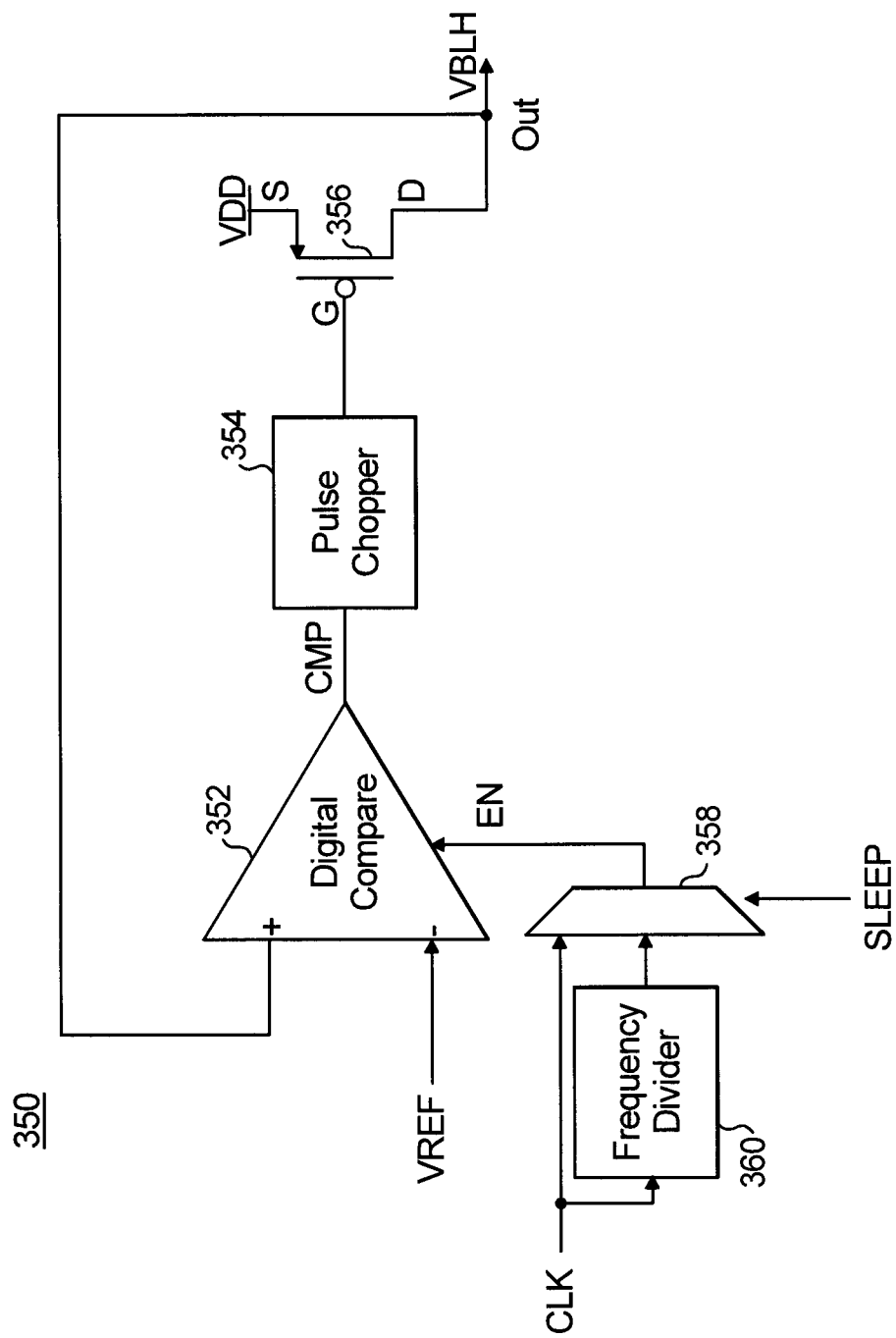
FIG. 3B is a schematic diagram depicting at least a portion of an exemplary linear voltage regulator operative to generate a bit line voltage suitable for use with the illustrative memory circuit shown in FIG. 1, according to another embodiment of the invention.

Specifically, by way of example only, FIG. 3B is a schematic diagram depicting at least a portion of an exemplary linear voltage regulator 350 operative to generate a bit line voltage, VBLH, suitable for use with the illustrative memory circuit 100 shown in FIG. 1, according to another embodiment of the invention. The linear regulator 350 is preferably incorporated into the bit pitch circuits 110 in memory circuit 100. Linear regulator 350, like regulator 300 shown in FIG. 3A, preferably comprises a comparator 352, which may be a digital comparator, a pulse chopper 354, or an alternative control circuit, and a PFET device 356, or an alternative voltage-controlled current source. PFET 356, which may be a power FET device, includes a source adapted for connection with an input voltage, which in this embodiment is VDD, a drain adapted to generate a regulated output voltage, VBLH, at an output node OUT of the regulator, and a gate adapted to receive a first control signal supplied thereto.

Comparator 352 is operative to receive a reference signal, VREF, at a first input thereof, which may be an inverting (−) input. A second input of the comparator 352, which may be a non-inverting (+) input, is connected with the drain of PFET 356 at node OUT and monitors the output voltage VBLH of the regulator 350. The comparator 352 is further operative to generate a signal, CMP, at an output thereof that is indicative of a difference between the reference signal VREF and the regulator output signal VBLH. Pulse chopper 354 is operative to receive the comparator output signal CMP and to generate the first control signal, which is supplied to the gate of the PFET 356, as a function thereof for controlling the output voltage VBLH of the regulator 350. The comparator 352, pulse chopper 354 and PFET 356, collectively, form a closed-loop feedback control system.

The linear regulator 350, like regulator 300, is also adapted to receive a control signal, SLEEP, indicative of a mode of operation of the regulator. For example, in a deep sleep mode of operation, the SLEEP signal is preferably asserted (e.g., a logic high level). However, rather than supplying the SLEEP signal directly to the pulse chopper 354, as in regulator 300, the pulse chopper does not directly receive the SLEEP control signal, and therefore the PFET 356 is not disabled during the deep sleep mode. Instead, deep sleep mode for linear regulator 350 involves a reduction of the output voltage VBLH compared to a level of the output voltage while in active mode (e.g., VBLH_sleep=VBLH_active/2) and an increase in a loop period time constant. The loop period time constant can be increased during deep sleep mode since this mode, by definition, does not involve a read, write or refresh operation of the memory cells.

To accomplish this, linear regulator 350 includes a multiplexer 358 and a frequency divider 360. Multiplexer 358 includes a first input adapted to receive a clock signal CLK supplied to the regulator 350, and a second input adapted to receive a prescribed division of the clock signal generated by frequency divider 360. The SLEEP control signal, which is indicative of the mode of operation of the regulator, is supplied to a control input of the multiplexer 358. Multiplexer 358 is operative to generate an output signal, EN, which is provided to a control input of the comparator 352, that is either the clock signal CLK or a divided-down version of the clock signal, as a function of the SLEEP signal. Since the regulator circuit 350 uses power predominantly when performing a comparison operation (i.e., when comparator 352 is enabled), frequency division of the input clock signal CLK will significantly reduce overall power consumption in the regulator by slowing down the comparison operation.

In accordance with another beneficial aspect of the invention, regulator 350 enables the bit line voltage VBLH to be lowered to voltage approximately half-way between ground and VBLH (i.e., the two voltages—representing logical "0" and "1," respectively—preferentially stored in the memory cells 102 of the exemplary memory circuit 100 shown in FIG. 1). It is important to note that, for an illustrative embedded DRAM (eDRAM) application, the precharge voltage of the bit lines in the active mode is either ground or VBLH, which is different than the bit line voltage during sleep mode (VBLH_sleep mode).

If such a regulated voltage (e.g., half-way between ground and VBLH) can be directed to the bit lines 104 of the memory circuit 100 (FIG. 1) through a programmable precharge network (not explicitly shown), or an alternative arrangement, during deep sleep mode, then a drain-to-source voltage across the access transistor 124 in each memory cell 102 can be advantageously minimized for both "0" and "1" states. In this manner, subthreshold leakage currents in the memory circuit 100 will be minimized, thereby beneficially maximizing (i.e., extending) data retention times in the memory circuit.

It is to be understood that PFETs 306 and 356 shown in FIGS. 3A and 3B, respectively, may be used to implement at least a portion of switch 118 shown in FIG. 1. While exemplary modifications to the bit pitch circuits 110 in FIG. 1 for implementing the deep sleep mode have been described in conjunction with FIGS. 3A and 3B, it is to be appreciated that modifications to the word line driver circuitry (e.g., word line driver 108 in FIG. 1) for implementing the deep sleep mode may also be made, according to aspects of the invention.

Figure 4A:
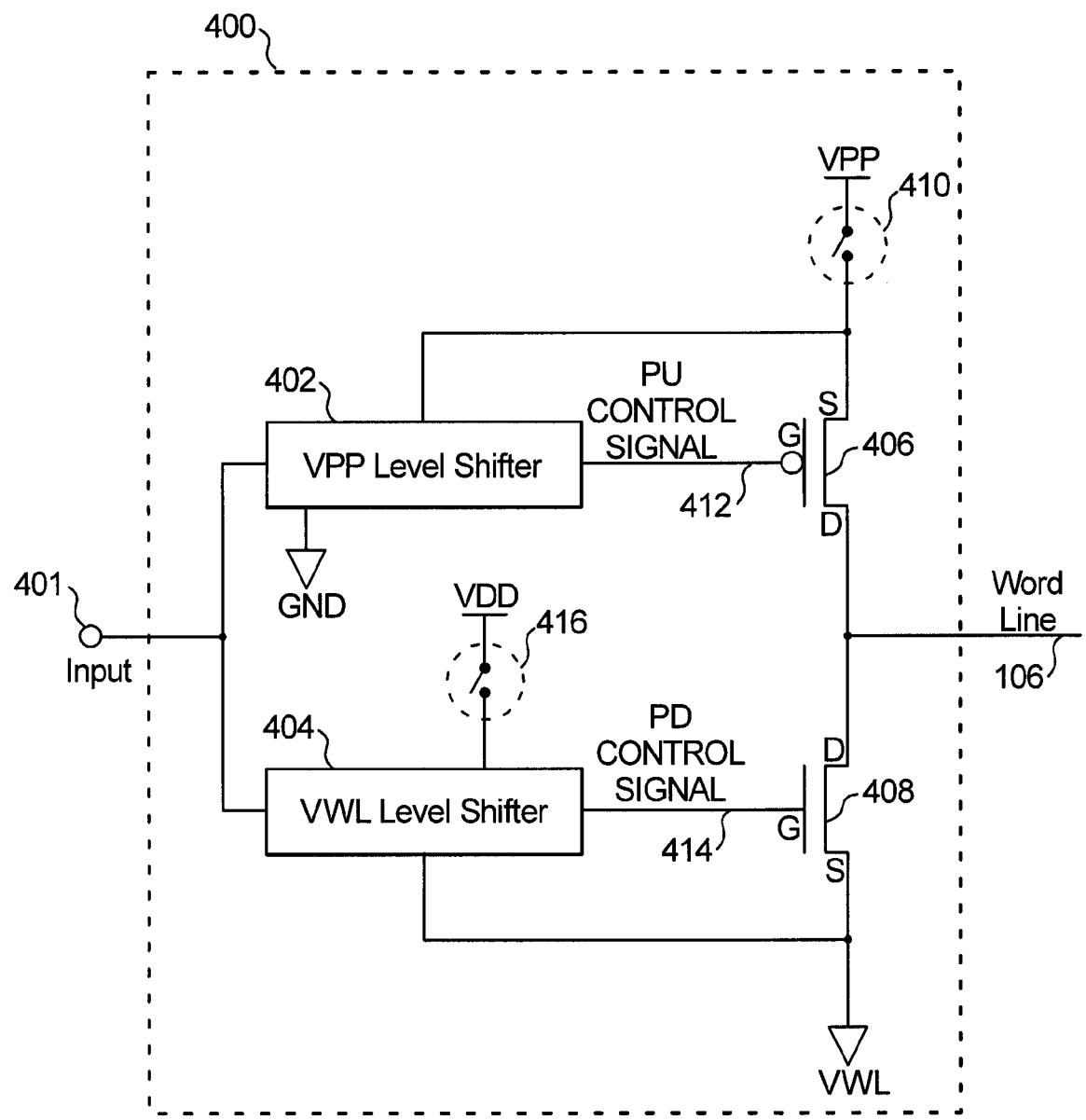
FIG. 4A is a schematic diagram depicting at least a portion of an exemplary word line driver circuit, according an embodiment of the invention.

Word line driver circuitry will now be discussed in conjunction with FIGS. 4A, 4B and 5. More particularly, FIG. 4A is a schematic diagram depicting at least a portion of an exemplary word line driver circuit 400, according an embodiment of the invention. Word line driver circuit 400 may be incorporated in the word line driver 108 shown in the illustrative memory circuit 100 of FIG. 1. Word line driver circuit 400 is operative to receive an input signal, at an input node 401 of the circuit, and to generate an output signal for driving a corresponding word line 106 to a desired voltage level as a function of the input signal.

With reference to FIG. 4A, the word line driver circuit 400 comprises a first voltage level shifter 402, which may be a VPP level shifter, associated with a pull-up portion of the circuit, and a second voltage level shifter 404, which may be a VWL level shifter, associated with a pull-down portion of the circuit. The VPP level shifter 402 is connected with a pull-up device, which in this embodiment is a PFET device 406, and the VWL level shifter 404 is connected with a pull-down device, which in this embodiment is an NFET device 408. A source of NFET device 408 is adapted for connection to VWL, a drain of 408 is connected with a corresponding word line 106, and a gate of 408 is adapted to receive a first control signal, which may be a pull-down (PD) control signal, generated by VWL level shifter 404. A source of PFET device 406 is adapted for connection to VPP via a first switch element 410, preferably implemented using a transistor device, a drain of 406 is connected with the corresponding word line 106, and a gate of 406 is adapted to receive a second control signal, which may be a pull-up (PU) control signal, generated by VPP level shifter 402.

VPP level shifter 402 is preferably connected with the VPP voltage supply via switch element 410 and is connected with ground (GND) as a supply return. VWL level shifter 404 is preferably connected with the VDD voltage supply via a second switch element 416, preferably implemented using a transistor device, and is connected with VWL as a supply return. In this configuration, the VPP level shifter 402 converts a GND-to-VDD (or VDD-to-GND) input signal supplied to input node 401 to a VPP-to-GND (or GND-to-VPP) output signal generated at an output node 412 of the VPP level shifter. Likewise, the VWL level shifter 404, in this embodiment, converts the GND-to-VDD (or VDD-to-GND) input signal supplied to input node 401 to a VDD-to-VWL (or VWL-to-VDD) output signal generated at an output node 414 of the VWL level shifter.

During deep sleep mode, switches 410 and 416 are opened, thereby effectively disconnecting power to VPP level shifter 402, VWL level shifter 404 and pull-up PFET 406. With PFET 406 disconnected from VPP, the source of 406 will leak to ground (e.g., zero volts). Likewise, with the VPP level shifter 402 disconnected from VPP, all internal circuit nodes in the VPP level shifter will leak to ground, including the PU control signal at node 412. Since both the source and gate of pull-up PFET 406 will be at ground potential, the gate-to-source voltage of PFET 406 will be zero (i.e., $V_{GS\_406}$=0), and hence PFET 406 will be turned off.

For the pull-down portion of the word line driver circuit 400, VWL level shifter 404 preferably includes one or more additional transistors to ensure that the PD control signal is driven to ground (e.g., zero volts) during deep sleep mode. With the PD control signal driven to ground, the gate of pull-down NFET 408 will be zero and the source of 408 will be at VWL, which is less than zero (e.g., about −300 mV). Since the gate-to-source voltage of NFET 408 will be greater than zero, NFET 408 will turn on. With PFET 406 turned off and NFET 408 turned on, the word line 106 will be pulled down to VWL. In this regard, although the gate-to-source voltage of NFET 408 ($V_{GS\_408}$) may be small (e.g., 300 mV), it is still large enough relative to that of PFET 406 (whose gate-to-source voltage is equal to zero) to make NFET 408 more conductive than PFET 406 and thereby pull down word line 106 to VWL.

Depending on the design of the memory cells in the memory circuit, word line driver circuit 400 can be modified to drive the corresponding word line to a suitable voltage level. For example, in certain applications each of the access transistors (e.g., transistor 124 in FIG. 1) in the memory cells (e.g., memory cell 102 in FIG. 1) is designed having a threshold voltage, $V_t$, which is large enough to ensure that the subthreshold leakage current attributable the memory cells is sufficiently low even when the word line is at ground potential during deep sleep mode, thus eliminating the need to drive the word line to a negative voltage. In this scenario, the word line driver circuit 400 can be beneficially modified to eliminate the VWL level shifter 404 and associated circuitry, as will be described in further detail below in conjunction with FIG. 4B.

Figure 4B:
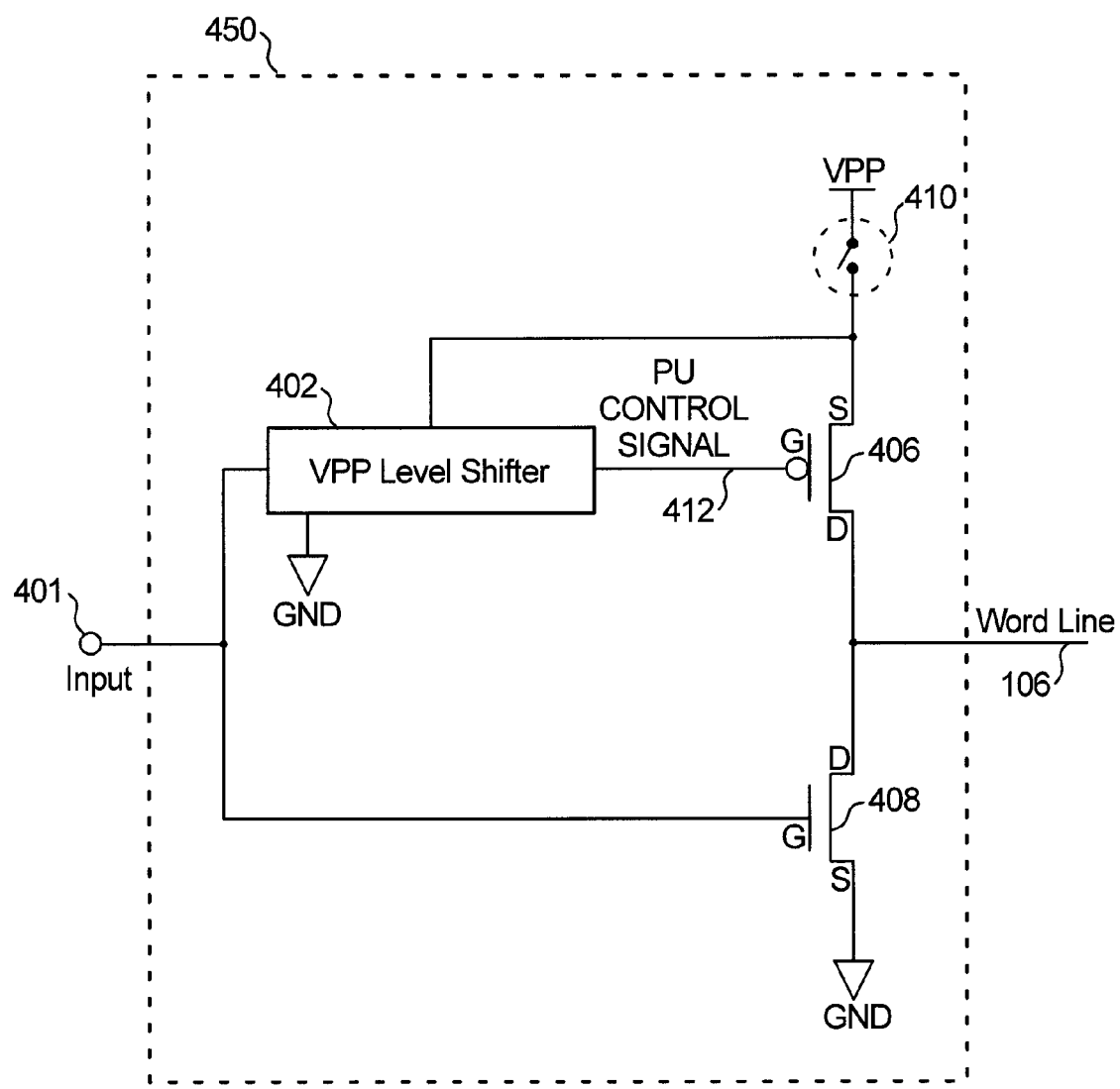
FIG. 4B is a schematic diagram depicting at least a portion of an exemplary word line driver circuit, according an alternative embodiment of the invention.

Specifically, FIG. 4B is a schematic diagram depicting at least a portion of an exemplary word line driver circuit 450, according an alternative embodiment of the invention. Word line driver circuit 450 is essentially the same as word line driver circuit 400 shown in FIG. 4A, except that the VWL level shifter 404 and associated circuitry (e.g., switch element 416) has been removed, as previously stated. Moreover, the pull-down NFET 408 is configured having a source adapted for connection to ground, a drain adapted for connection to the corresponding word line 106, and a gate adapted to directly receive the input signal at node 401 (i.e., without voltage level shifting). In this application, the word line 106 is driven from ground to VPP (rather than from VWL to VPP), as in the word line driver circuit 400 depicted in FIG. 4A.

WIth continued reference to FIG. 4B, during deep sleep mode, pull-up PFET 406 is turned off, as previously described. A collective leakage current through the level shifter 402, PFET 406, and NFET 408 pulls the word line 106 to ground. As previously explained, this arrangement requires modification of the memory cells in a manner which increases the threshold voltage $V_t$ of the respective access transistors so as to prevent subthreshold leakage current in the cells without the need to drive the gate of each access transistor below ground potential.

An illustrative voltage level shifter suitable for use with the word line driver circuit 400 shown in FIG. 4A will now be described in conjunction with FIG. 5. It is to be understood, however, that although the voltage level shifter is particularly designed for generating a pull-down control signal, and thus suitable for implementing the exemplary VWL level shifter 404 shown in FIG. 4A, it will become apparent to those skilled in the art given the teachings herein that basic modifications to the illustrative voltage level shifter can be made for similarly generating a pull-up control signal.

Figure 5:
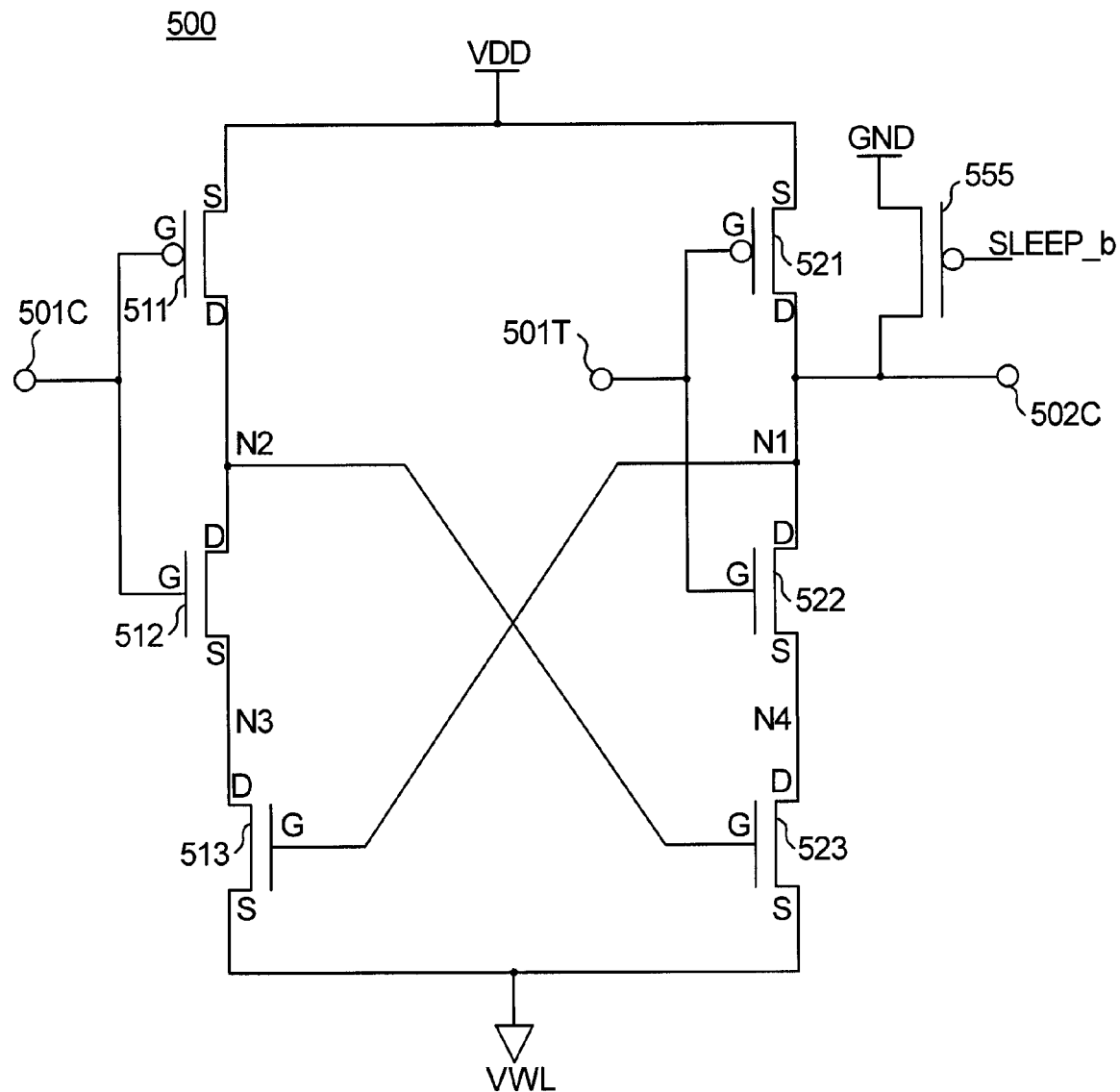
FIG. 5 is a schematic diagram depicting at least a portion of an exemplary voltage level shift circuit suitable for use in the illustrative word line driver circuit show in FIG. 4A, according to an embodiment of the invention.

By way of example only and without loss of generality, FIG. 5 is a schematic diagram depicting at least a portion of an exemplary voltage level shifter circuit 500, which may be used to implement the VWL level shifter shown in FIG. 4A, according to an embodiment of the invention. Voltage level shifter 500 includes a first NFET transistor 513 and a second NFET transistor 523 connected in a cross-coupled configuration. Sources of transistors 513 and 523 are adapted for connection to a first voltage supply, which may be VWL in this embodiment, a gate of transistor 513 is connected to a first node N1, which forms an output node 502C of the voltage level shifter 500, a gate of transistor 523 is connected to a second node N2, which may form a true output of the voltage level shifter, a drain of transistor 513 is connected to a third node N3, and a drain of transistor 523 is connected to a fourth node N4.

Voltage level shifter 500 further includes a pair of inverters operatively coupled to the first and second NFET transistors 513 and 523. Specifically, a first inverter is comprised of a third NFET transistor 512 and a first PFET transistor 511, and a second inverter is comprised of a fourth NFET transistor 522 and a second PFET transistor 521. A source of transistor 512 is connected to the drain of transistor 513 at node N3, a drain of transistor 512 is connected to a drain of transistor 511 and gate of transistor 523 at node N2, a gate of transistor 512 is connected to a gate of transistor 511 and forms a complement input node 501C for receiving a complement input signal supplied to the voltage level shifter 500, and a source of transistor 511 is adapted for connection to a second voltage supply, which may be VDD. A source of transistor 522 is connected to the drain of transistor 523 at node N4, a drain of transistor 522 is connected to a drain of transistor 521 and the gate of transistor 513 at node N1, a gate of transistor 522 is connected to a gate of transistor 521 and forms a true input node 501T for receiving a true input signal supplied to the voltage level shifter 500, and a source of transistor 521 is adapted for connection to VDD.

The voltage level shifter 500 receives true and complement input signals at the true input node 501T and complement input node 501C, respectively. The voltage level shifter 500 is operative to generate an output signal at the output node 502C which is of the same phase as the complement input signal supplied to input node 501C and of opposite phase to the true input signal supplied to input node 501T. Thus, the illustrative voltage level shifter 500 is an inverting level shifter. The invention, however, is not limited to an inverting voltage level shifter. For example, reassignment of the inputs, such that input node 501T is adapted to receive the complement input signal and input node 501C is adapted to receive the true input signal, would result in the output signal generated at output node 502C being of the same phase as the true input signal, and would therefore be considered to be non-inverting.

The true and complement input signals supplied to input nodes 501T and 501C, respectively, are preferably logic level signals that may be referenced to different voltage supplies than supplies VWL and VDD (e.g., GND to VDD voltage levels). Output node 502C will generate an output signal therefrom which is referenced to voltage supplies VDD and VWL, and will therefore have a different range of voltage levels than the input signals supplied to input nodes 501T and 501C of the voltage level shifter 500. In the embodiment shown, the voltage levels of the output signal at node 502C will preferably vary between VDD (e.g., about 1.1 volts) and VWL (e.g., about −300 mV) as a function of the logic state of the input signals. When used in the word line driver circuit 400, output node 502C of the voltage level shifter 500 is coupled to the gate of transistor 408 at node 414, and therefore the output signal generated by the voltage level shifter 500 at node 502C serves as the PD control signal in the word line driver circuit.

In terms of operation, when the input signal applied to input node 501C is a logic high level referenced to VDD (e.g., about 1.1 volts), the input signal applied to input 501T, being a complement of the signal applied to node 501C, will be a logic low level, which may be ground (e.g., 0 volts). Input 501T being low will significantly reduce the conductivity of transistor 522 (subsequently 522 turns off) and turn on transistor 521, thereby pulling up node N1 to VDD (e.g., about 1.1 volts). Node N1 being high will turn on transistor 513, thereby pulling down node N3 to VWL (e.g., about −300 mV). Similarly, input 501C being high will turn off transistor 511 (assuming the voltage difference between the gate and source of transistor 511 is less than a threshold voltage of transistor 511) and will turn on transistor 512, thereby pulling node N2 low and turning off transistor 523. Thus, the output signal generated at output node 502C will be a logic high level referenced to VDD.

Alternatively, when the input signal applied to input node 501C is a logic low level (e.g., 0 volts), the input signal applied to input 501T, being a complement of the signal applied to node 501C, will be a logic high level referenced to VDD. Input node 501C being a logic low level will significantly reduce the conductivity of transistor 512 (subsequently 512 turns off) and turn on transistor 511, thereby pulling up node N2 to VDD. Node N2 being high will turn on transistor 523, thereby pulling down node N4 to VWL. Similarly, input node 501T being high will turn off transistor 521 and turn on transistor 522, thereby pulling node N1 low. Thus, the output signal generated at output node 502C will be a logic low level referenced to VWL rather than to ground.

In deep sleep mode, VDD is disconnected from the voltage level shifter 500, and thus all circuit nodes will leak to VWL potential. In order to generate a PD control signal at output node 502C which is at ground potential in deep sleep mode, a third PFET 555 is included in the voltage level shifter 500. A source of transistor 555 is adapted for connection with ground, a drain of transistor 555 is connected to output node 502C and a gate of transistor 555 is adapted to receive a control signal, SLEEP_b. Control signal SLEEP_b is preferably driven to VWL during sleep mode and is driven to VDD during active mode. Hence, transistor 555 will be turned off in active mode and turned on lightly during deep sleep mode. In deep sleep mode, with transistors 521, 522 and 523 turned off and transistor 555 turned on, output node 502C (which is the PD control signal shown in FIG. 4A) will be pulled up to ground potential. With node 502C (PD control signal) at ground potential, NFET 408 shown in FIG. 4A will be turned on relative to PFET 406 due to its small but nonzero gate-to-source voltage (e.g. 300 mV). Hence, the corresponding word line 106 will be pulled down to VWL by NFET 408.

Figure 6:
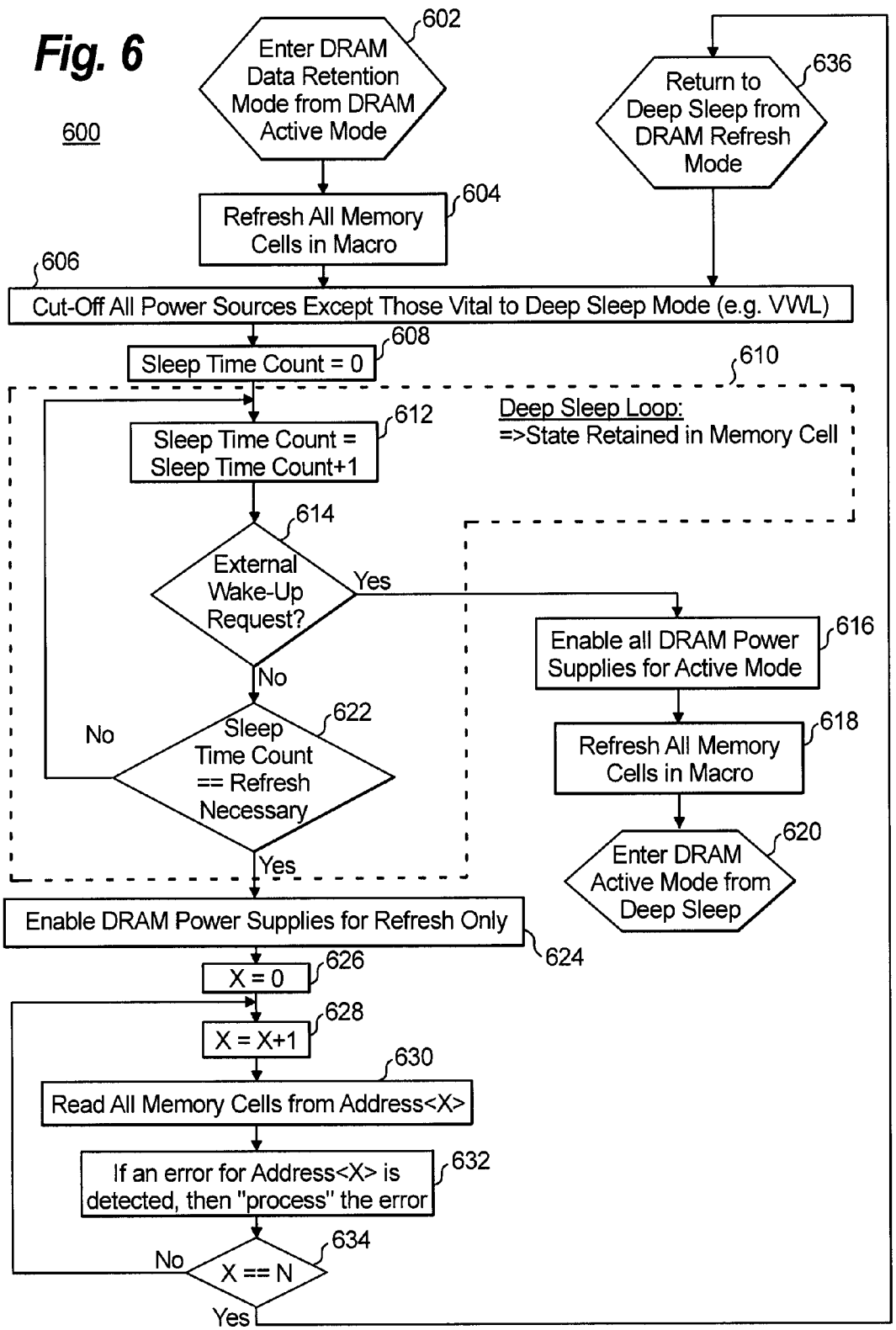
FIG. 6 is a flow diagram illustrating at least a portion of an exemplary methodology for substantially extending the duration of the deep sleep mode in a memory circuit, according to an embodiment of the invention.

In accordance with another embodiment of the invention, the illustrative methodology 200 for performing periodic wake-up and refresh and for entering and exiting data retention mode in a memory circuit previously described in conjunction with FIG. 2 can be modified using error correction coding (ECC), as shown in FIG. 6. Specifically, FIG. 6 is a flow diagram illustrating at least a portion of an exemplary methodology 600 for substantially extending the duration of the deep sleep mode in a memory circuit (e.g., memory circuit 100 shown in FIG. 1) using ECC, according to an embodiment of the invention.

With reference to FIG. 6, method 600 begins in a manner similar to method 200. However, in contrast to method 200, method 600 enables substantially longer deep sleep periods. By allowing a restricted number of data errors within the memory cells 102 to occur during deep sleep mode, which are corrected during the refresh/correction process in steps 626 through 634, the deep sleep period is beneficially extended well beyond the data retention time of the memory cells 102, compared to method 200.

More particularly, method 600 enters DRAM retention mode from an active mode in step 602. While in data retention mode, all memory cells in the memory circuit (e.g., DRAM macro) are refreshed in step 604. Once all memory cells have been refreshed, all power sources except those vital to deep sleep mode (e.g., VWL) are cut-off from their respective memory circuits in step 606. A counter, which may be a sleep time counter, or alternative time tracking means, is initialized in step 608. In this embodiment, the sleep time counter is preferably set to zero initially, although the invention is not limited to tracking time and/or process cycles in this manner. At this point, method 600 enters a deep sleep loop 610. The deep sleep loop 610 is preferably operative in a manner consistent with that described in conjunction with the deep sleep loop 210 shown in FIG. 2 and described above.

In the deep sleep loop 610, the sleep time counter is incremented, preferably by one, in step 612. It is to be appreciated that, in accordance with other embodiments, the sleep time counter may be preset with a prescribed value in step 608 and then decremented (e.g., by one or by another value) in step 612 for each pass of the deep sleep loop. After incrementing the sleep time counter, step 614 checks to determine if a wake-up request has been received.

If a wake-up request is received, method 600 exits the deep sleep loop 610 and continues at step 616, wherein all DRAM power supplies are enabled in preparation for entry into an active mode of operation of the memory circuit. Next, all memory cells in the memory circuit are refreshed in step 618, after which method 600 enters the active mode of operation from the deep sleep mode in step 620. From the active mode, method 600 may revert to step 602, wherein the memory circuit enters the data retention mode once again.

If a wake-up request is not received, as determined in step 614, the deep sleep loop 610 resumes by checking the sleep time counter in step 622 to determine if the memory cells need to be refreshed. This may be accomplished, for example, by comparing the value of the sleep time counter with a prescribed number indicative of a maximum length of a refresh cycle of the memory circuit. If the maximum refresh period has not been reached, the method 600 proceeds back to step 612 where the sleep time counter is incremented and the next pass of the deep sleep loop 610 is processed.

If the maximum refresh period has been reached, as determined by checking the sleep time counter in step 622 against a prescribed threshold value, method 600 exits the deep sleep loop 610 and process control resumes at step 624 where DRAM power supplies used exclusively for performing a memory refresh operation are enabled (e.g., VPP, VBLH, and VDD associated with a row address counter in the word line driver circuit). Next, all memory cells in the memory circuit are read. To accomplish this, an address counter (i.e., address pointer), X, is initialized in step 626, where X is an integer. In this embodiment, the counter is set to zero and is incremented by one in subsequent steps. However, it is to be understood that the invention is not limited to this method of tracking addresses. For example, the address counter may be initialized to a maximum address value and then decremented (by one or another value) in subsequent process steps.

Once the address counter has been initialized in step 626, the address counter is preferably incremented in step 628, such as by adding one to the previous counter value (e.g., X=X+1). Next, all memory cells in the memory circuit (e.g., DRAM macro) at the address <X> stored in the address counter are read in step 630. If an error is detected in the data stored at address <X> (e.g., using an error detection means, including but not limited to parity check, checksum, cyclic redundancy check (CRC), cryptographic hash functions, etc.), such detected error is processed in step 632, preferably by correcting the error using an ECC (e.g., Hamming code, Convolutional code, Reed-Solomon code).

The address X is checked in step 634 to determine whether all addresses in the memory circuit have been read, such as by comparing the value X with a prescribed maximum address N, where N is an integer. If it is determined that all addresses have not been read, method 600 returns to step 628 to increment the address counter and begin reading the next address location in the memory circuit. If it is determined that all memory addresses have been read, the method 600 ends by returning the memory circuit to the deep sleep mode from the DRAM refresh mode in step 636, at which point a second portion of the method 600 begins.

It is important to recognize that the process of reading all the data from all the memory cells 102 in steps 626 through 634, for the purpose of checking the validity of the data, refreshes all the memory cells 102 in the memory, thereby eliminating the need for a separate refresh operation. Fundamental to a DRAM read cycle, all the memory cells 102 selected by an active word line 106 share their charge with bit lines 104. In the second half of the DRAM read cycle, that lost charge is restored to the selected memory cells 106, such as, for example, via latching sense amplifiers included within bit pitch circuits 110. Hence, the explicit refresh step 226 of FIG. 2 is realized in FIG. 6 by the error detection and resolution loop—e.g., steps 626 through 634.

The second portion of method 600 begins by returning to the deep sleep mode from the DRAM refresh mode in step 636. To return to the deep sleep mode, all power sources except those vital to deep sleep mode (e.g., VWL) are preferably cut-off from their respective memory circuits in step 606. As apparent from FIG. 6, this second portion of method 600 is similar to the first portion, with the exception that the refresh operation performed in step 604 is omitted. The method 600 then continues as previously described by initializing the sleep time counter, or alternative time tracking element, by setting the sleep time counter to a prescribed value in step 608; zero in this embodiment, although the invention is not limited to any particular initialization value. The method 600 then enters the deep sleep loop 610 and the process continues as described above.

The embodiment shown in FIG. 6 beneficially enhances the data retention mode so that, during the refresh process, error detection and correction codes are used to substantially extend the deep sleep period by allowing for the possibility that a small population of leaky memory cells will fail. As will become apparent to those skilled in the art given the teachings herein, the error detection and correction code used is preferably selected based on the maximum number of expected errors, so that such errors can be corrected; otherwise, data integrity would be undesirably impacted. Thus, if a maximum of one error is expected during any given read operation in the memory circuit, essentially any double-error detection/single-error correction code will suffice.

Figure 7:
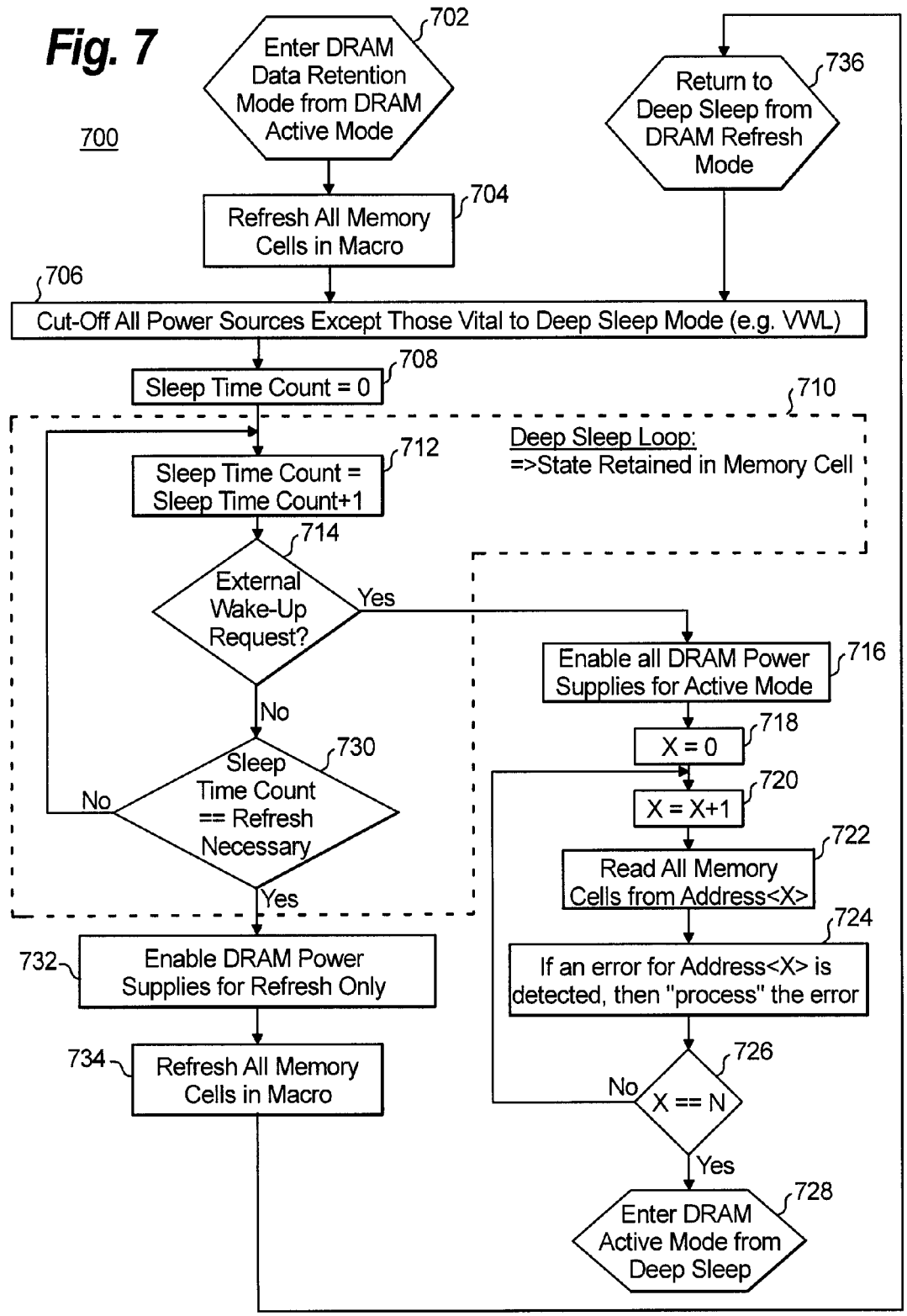
FIG. 7 is a flow diagram illustrating at least a portion of an exemplary methodology for substantially extending the duration of the deep sleep mode in a memory circuit, according to another embodiment of the invention.

With reference now to FIG. 7, a flow diagram illustrates at least a portion of an exemplary methodology 700 for substantially extending the duration of the deep sleep mode in a memory circuit (e.g., memory circuit 100 shown in FIG. 1), like method 600, using error detection, according to another embodiment of the invention. However, in contrast to method 600 which uses ECC to correct errors during each deep sleep cycle when detected, method 700 permits those errors to accumulate over a multiplicity of deep sleep cycles. The advantage of this embodiment is that the refresh step 734, required between periods of deep sleep, consumes substantially less power than the refresh/error correction steps 626 through 634. As will become apparent to those skilled in the art given the teachings herein, method 700 shares many similar steps performed by illustrative methods 200 and 600 depicted in FIGS. 2 and 6, respectively.

More particularly, method 700 enters DRAM retention mode from an active mode in step 702. While in data retention mode, all memory cells in the memory circuit (e.g., DRAM macro) are refreshed in step 704. Once all memory cells have been refreshed, all power sources except those vital to deep sleep mode (e.g., VWL) are cut-off from their respective memory circuits in step 706. A counter, which may be a sleep time counter, or alternative time tracking means, is initialized in step 708. In this embodiment, the sleep time counter is preferably set to zero initially, although the invention is not limited to tracking time and/or process cycles in this manner. Method 700 then enters a deep sleep loop 710, described in further detail below. Deep sleep loop 710 is preferably operative in a manner consistent with the deep sleep loop 210 previously described in conjunction with FIG. 2.

In the deep sleep loop 710, the sleep time counter is incremented, preferably by one, in step 712. It is to be appreciated that, in accordance with other embodiments, the sleep time counter may be preset with a prescribed value in step 708 and then decremented (e.g., by one or by another value) in step 712 for each pass of the deep sleep loop. After incrementing the sleep time counter, step 714 checks to determine if a wake-up request has been received.

If a wake-up request is received, method 700 exits the deep sleep loop 710 and continues at step 716, wherein all DRAM power supplies are enabled in preparation for entry into an active mode of operation of the memory circuit. Next, all memory cells in the memory circuit are read. To accomplish this, an address counter (i.e., address pointer), X, is initialized in step 718, where X is an integer. In this embodiment, the counter is set to zero and is incremented by one in subsequent steps. However, it is to be understood that the invention is not limited to this method of tracking addresses. For example, the address counter may be initialized to a maximum address value and then decremented (by one or another value) in subsequent process steps.

Once the address counter has been initialized in step 718, the address counter is preferably incremented in step 720, such as by adding one to the previous counter value (e.g., X=X+1). Next, all memory cells in the memory circuit (e.g., DRAM macro) at the address <X> stored in the address counter are read in step 722. If an error is detected in the data stored at address <X> (e.g., using an error detection means, including but not limited to parity check, checksum, cyclic redundancy check (CRC), cryptographic hash functions, Berger Codes, etc.), such detected error is processed in step 724, either by fetching new data from another memory in the system or by using ECC. The Berger code-based procedures for handling unidirectional errors—the sort expected to occur for bit lines pre-charged to ground, the preferred embodiment—are well described, for example, in U.S. Pat. No. 7,290,203, entitled "Dynamic Memory Architecture Employing Passive Expiration of Data," by Emma et. al., the disclosure of which is incorporated herein by reference in its entirety for all purposes.

The address X is checked in step 726 to determine whether all addresses in the memory circuit have been read, such as by comparing the value X with a prescribed maximum address N, where N is an integer. If it is determined that all addresses have not been read, method 700 returns to step 720 to increment the address counter and begin reading the next address location in the memory circuit. If it is determined that all memory addresses have been read, the method 700 ends by entering the DRAM active mode from the deep sleep mode in step 728.

If a wake-up request is not received, as determined in step 714, the deep sleep loop 710 resumes by checking the sleep time counter in step 730 to determine whether or not the memory cells need to be refreshed. This may be accomplished, for example, by comparing the value of the sleep time counter with a prescribed number indicative of a maximum length of a refresh cycle of the memory circuit. If the maximum refresh period has not been reached, the method 700 proceeds back to step 712 where the sleep time counter is incremented and the next pass of the deep sleep loop 710 is processed.

If the maximum refresh period has been reached, as determined by checking the sleep time counter in step 730 against a prescribed threshold value, method 700 exits the deep sleep loop 710 and process control resumes at step 732 where DRAM power supplies used exclusively for performing a memory refresh operation are enabled (e.g., VPP, VBLH, and VDD associated with a row address counter in the word line driver circuit).

Next, all memory cells in the memory circuit are refreshed in step 734, after which method 700 returns to the deep sleep mode from the refresh mode in step 736, whereby a second portion of the method 700 begins.

The second portion of method 700 begins by returning to the deep sleep mode from the DRAM refresh mode in step 736. To return to the deep sleep mode, all power sources except those vital to deep sleep mode (e.g., VWL) are preferably cut-off from their respective memory circuits in step 706. As apparent from FIG. 7, this second portion of method 700 is similar to the first portion, with the exception that the refresh operation performed in step 704 is omitted. The method 700 then continues as previously described by initializing the sleep time counter, or alternative time tracking element, by setting the sleep time counter to a prescribed value in step 708 (zero in this embodiment, although the invention is not limited to any particular initialization value). The method 700 then enters the deep sleep loop 710 and the process continues as previously described.

One or more embodiments of the invention or elements thereof may be implemented in the form of an article of manufacture including a machine readable medium that contains one or more programs which when executed implement such method step(s); that is to say, a computer program product including a tangible computer readable recordable storage medium (or multiple such media) with computer usable program code stored thereon in a non-transitory manner for performing the method steps indicated. Furthermore, one or more embodiments of the invention or elements thereof can be implemented in the form of an apparatus including a memory and at least one processor (e.g., vector processor) that is coupled with the memory and operative to perform, or facilitate the performance of, exemplary method steps.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Yet further, in another aspect, one or more embodiments of the invention or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a tangible computer-readable recordable storage medium (or multiple such media). Appropriate interconnections via bus, network, and the like can also be included.

Figure 8:
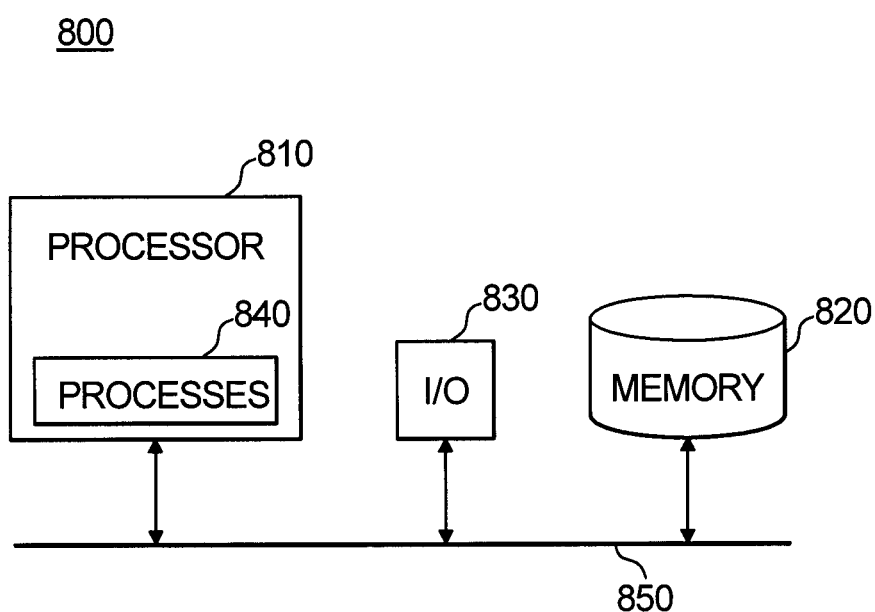
FIG. 8 is a block diagram depicting at least a portion of an exemplary processing system, formed in accordance with an aspect of the present invention.

Embodiments of the invention may be particularly well-suited for use in an electronic device or alternative system (e.g., computing system, communications system, etc.). For example, FIG. 8 is a block diagram depicting at least a portion of an exemplary processing system 800, formed in accordance with an embodiment of the invention. System 800, which may represent, for example, a dynamic memory system or a portion thereof, may include a processor 810, memory 820 coupled with the processor (e.g., via a bus 850 or alternative connection means), as well as input/output (I/O) circuitry 830 operative to interface with the processor. The processor 810 may be configured to perform at least a portion of the functions of the present invention (e.g., by way of one or more processes 840 which may be stored in memory 820), illustrative embodiments of which are shown in the previous figures and described herein above.

It is to be appreciated that the term "processor" as used herein is intended to include any processing device, such as, for example, one that includes a CPU and/or other processing circuitry (e.g., digital signal processor (DSP), network processor, microprocessor, etc.). Additionally, it is to be understood that a processor may refer to more than one processing device, and that various elements associated with a processing device may be shared by other processing devices. The term "memory" as used herein is intended to include memory and other computer-readable media associated with a processor or CPU, such as, for example, DRAM, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., display, etc.) for presenting the results associated with the processor.

Accordingly, an application program, or software components thereof, including instructions or code for performing the methodologies of the invention, as described herein, may be stored in a non-transitory manner in one or more of the associated storage media (e.g., ROM, fixed or removable storage) and, when ready to be utilized, loaded in whole or in part (e.g., into RAM) and executed by the processor. In any case, it is to be appreciated that at least a portion of the components shown in the previous figures may be implemented in various forms of hardware, software, or combinations thereof (e.g., one or more DSPs with associated memory, application-specific integrated circuit(s) (ASICs), functional circuitry, one or more operatively programmed general purpose digital computers with associated memory, etc.). Given the teachings of the invention provided herein, one of ordinary skill in the art will be able to contemplate other implementations of the components of the invention.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with the present invention can be employed in essentially any application and/or electronic system in which dynamic memory systems may be employed. Suitable systems for implementing techniques of the invention may include, but are not limited to, personal computers, mobile phones, communication networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A memory device, comprising:
   one or more dynamic memory cells, each of the memory cells having a corresponding bit line and a corresponding word line connected thereto for individually accessing the memory cells;
   a word line circuit coupled with at least one word line;
   a bit line circuit coupled with at least one bit line;
   at least one control circuit coupled with the bit and word line circuits, the control circuit being operative, via the bit line circuit, the word line circuit, and the bit and word lines, to cause state information to be stored in the memory cells; and
   at least one switching element operative to selectively connect the memory cells, the bit and word line circuits, and the control circuit to at least one power supply as a function of at least one control signal;
   wherein the control circuit is operative to generate the at least one control signal for disconnecting at least portions of the word line and bit line circuits from the power supply while state information is retained in the memory cells.

2. The memory device of claim 1, wherein the word line circuit comprises at least one word line driver connected with a corresponding word line.

3. The memory device of claim 2, wherein the word line driver is operative to generate a negative word line voltage maintained on the corresponding word line while power to the word line circuit is disconnected.

4. The memory device of claim 1, wherein the bit line circuit comprises at least one bit line precharge circuit and a sense amplifier connected with a corresponding bit line.

5. The memory device of claim 4, wherein a bit line voltage generated by the bit line precharge circuit is maintained at a prescribed voltage level while power to the bit line circuit is disconnected.

6. The memory device of claim 1, wherein the at least one switching element comprises at least one transistor having a first source/drain connected to a first circuit node in the memory device, a second source/drain connected to a second circuit node in the memory device, and a gate adapted to receive the control signal, the transistor being operative to electrically connect the first and second circuit nodes as a function of the control signal.

7. The memory device of claim 1, wherein the control circuit is operative during a data retention period to alternate between at least first and second modes of operation, wherein in the first mode, data stored in the memory cells is refreshed, and in the second mode, state information is retained in the memory cells while power to at least the bit line circuit is disconnected.

8. The memory device of claim 7, wherein the second mode is a deep sleep mode and the first mode is a refresh mode, and wherein the first mode has a first duration associated therewith which is substantially shorter than a second duration associated with the second mode.

9. The memory device of claim 8, wherein the second duration is at least 10 times greater than the first duration.

10. The memory device of claim 1, wherein the control circuit is operative to utilize error correction coding to extend a data retention period of the memory device.

11. The memory device of claim 1, wherein the bit line circuit comprises:
   a transistor adapted for connection between the at least one power supply and a corresponding bit line, the transistor being operative to receive a first control signal and to selectively connect the corresponding bit line with the at least one power supply as a function of the first control signal;
   a comparator having a first input connected with the corresponding bit line and a second input adapted to receive a reference voltage, the comparator being operative to generate a second control signal indicative of a difference between a voltage on the corresponding bit line and the reference voltage; and
   a controller operative to receive the second control signal and to generate the first control signal such that the voltage on the corresponding bit line is maintained at about the reference voltage.

12. The memory device of claim 11, wherein the bit line circuit is operative to receive a third control signal indicative of a mode of operation of the memory device, the transistor being turned off, thereby disconnecting the corresponding bit line from the power supply, as a function of the third control signal.

13. The memory device of claim 12, wherein the bit line circuit further comprises:
   a frequency divider adapted to receive an input clock signal supplied to the bit line circuit and to generate an output clock signal having a frequency that is a prescribed division of a frequency of the input clock signal; and a multiplexer having a first input adapted to receive the input clock signal, a second input adapted to receive the output clock signal, and a control input adapted to receive the third control signal, the multiplexer being operative to generate a fourth control signal indicative of one of the input clock signal and the output clock signal as a function of the third control signal.

14. The memory device of claim 1, wherein the word line circuit includes at least one word line driver, the at least one word line driver comprising:

a pull-up transistor having a first source/drain adapted for connection to a first voltage supply via a first switching element, a second source/drain connected with a corresponding word line, and a gate adapted to receive a first control signal;

a pull-down transistor having a first source/drain adapted for connection to a second voltage supply, a second source/drain connected with the corresponding word line, and a gate adapted to receive a second control signal;

a first voltage level shifter operative to receive an input signal referenced to a first set of voltages, and to generate the first control signal referenced to a second set of voltages; and a second voltage level shifter operative to receive the input signal, and to generate the second control signal referenced to a third set of voltages.

15. The memory device of claim 14, wherein the word line driver is operative in a first mode to drive the corresponding word line between the first and second voltage supplies as a function of the input signal and is operative in a second mode to disconnect power to the first and second voltage level shifters and to drive the corresponding word line to the second voltage supply.

16. A method for facilitating a data retention mode in a memory circuit including a plurality of dynamic memory cells and bit and word lines coupled to the memory cells, each of the memory cells having a unique pair of a corresponding bit line and a corresponding word line associated therewith for individually accessing the memory cells, the method comprising the step of:

upon receiving a request to enter the data retention mode, interleaving long periods of operation of the memory circuit in a first mode, wherein power to at least circuitry driving the bit lines is disconnected and the memory cells retain their respective state information stored therein, with short bursts of operation of the memory circuit in a second mode, wherein power is restored exclusively to circuitry used in performing a refresh of the memory cells and the memory cells are refreshed.

17. The method of claim 16, wherein the first mode is a deep sleep mode and the second mode is a refresh mode.

18. The method of claim 16, further comprising:

tracking a duration of time that the memory circuit is operating in the first mode; and when the duration of time that the memory circuit is operating in the first mode reaches a prescribed data retention period, switching operation of the memory circuit to the second mode to initiate a refresh of the memory cells.

19. The method of claim 18, wherein the step of tracking the duration of time that the memory circuit is operating in the first mode comprises:

setting a first counter to a prescribed value;

determining whether the prescribed data retention period has been reached by performing one of (i) incrementing the first counter and determining whether the first counter has reached a prescribed maximum value and (ii) decrementing the first counter and determining whether the first counter is equal to zero; and when the prescribed data retention period has been reached, restoring power exclusively to circuitry used in performing the refresh of the memory cells and switching operation of the memory circuit to the second mode.

20. The method of claim 16, further comprising exiting the first mode of operation when a request to enter an active mode of operation of the memory circuit is received.

21. The method of claim 16, further comprising performing error correction to thereby extend the data retention period of the memory circuit.

22. The method of claim 21, wherein the step of performing error correction comprises, during each cycle of operation of the memory circuit in the second mode:

for all address locations in the memory circuit, reading data stored at a given one of the memory address locations;

detecting whether there is at least one error in the data corresponding to the given address location;

processing the at least one error in the data corresponding to the given address location; and returning to the first mode of operation of the memory circuit.

23. The method of claim 22, wherein the step of performing error correction comprises:

setting a second counter to a prescribed value;

performing one of (i) incrementing the second counter and determining whether the second counter has reached a value indicative of a maximum number of address locations of the memory circuit and (ii) decrementing the second counter and determining whether the second counter is equal to zero; and performing error correction to correct the data stored at an address location corresponding to the value of the second counter.

24. The method of claim 21, wherein the step of performing error correction comprises:

accumulating errors over a plurality of cycles of operation of the memory circuit in the second mode; and processing the errors upon receiving a request to enter an active of operation of the memory circuit.

25. The method of claim 24, wherein the step of processing the errors is performed using a Berger code.

\* \* \* \* \*